United States Patent [19]

Sugino et al.

[11] 4,365,336
[45] Dec. 21, 1982

[54] TERRACED SUBSTRATE SEMICONDUCTOR LASER

[75] Inventors: Takashi Sugino, Takatsuki; Hirokazu Shimizu, Toyonaka; Masaru Wada, Takatsuki; Kunio Itoh, Uji, all of Japan

[73] Assignee: Matsushita Electric Industrial Co., Ltd., Kadoma, Japan

[21] Appl. No.: 208,021

[22] Filed: Nov. 18, 1980

[30] Foreign Application Priority Data

Nov. 19, 1979 [JP] Japan .............................. 54-150409

[51] Int. Cl.³ ................................................ H01S 3/19
[52] U.S. Cl. ........................................ 372/45; 357/17; 372/46
[58] Field of Search .................... 351/94.5 H; 357/17, 357/18; 372/45, 46

[56] References Cited

FOREIGN PATENT DOCUMENTS 55-96694 7/1980 Japan .............................. 331/94.5 H

OTHER PUBLICATIONS

Itoh et al. "Semiconductor Lasers Overcome all Deficiencies", *JEE*, Jun. 1979, pp. 30-33.

*Primary Examiner*—James W. Davie
*Attorney, Agent, or Firm*—Cushman, Darby & Cushman

[57] ABSTRACT

A terraced-substrate structure semiconductor laser in accordance with the present invention comprises:
  a terrace-shaped semiconductor substrate having an upper face, a lower face and a step part disposed between said upper face and said lower face,
  a clad layer formed on said terrace shaped semiconductor substrate and including at least an upper part formed on said upper face and a step part having a triangular section and formed at a corner defined by said lower face and said step part, said step part being thicker than said upper part,
  an active layer formed on said first clad layer and including a horizontal upper part formed on said upper part of said first clad layer and an oblique lasing region formed oblique on said step part of said first clad layer, but excluding a lower horizontal part, hitherto formed on said lower face,
  a current injection electrode having a stripe shaped injection face disposed above said lasing region,
  the improvement is that said active layer is terminated substantially at a lower end of said oblique lasing region by etching away said lower horizontal part of the active layer and said clad layer at the part on said lower face, thereby limiting a path of injected current to enter only in said lasing region.

5 Claims, 11 Drawing Figures

TERRACED SUBSTRATE SEMICONDUCTOR LASER

BACKGROUND OF THE INVENTION

1. Field of the Invention

The present invention relates to an improvement in a semiconductor laser. Especially the present invention relates to a semiconductor laser made by liquid phase epitaxial growth method.

2. Description of Prior Art

Together with remarkable progresses of light communication technology and disk type video recording technology, semiconductor lasers are regarded as most important devices to serve as light sources to be used in such technologies. Accordingly, there are great requirements on reliability and performance of such semiconductor lasers. That is, lasers of longer lifetime and lasing with more stable fundamental mode are required.

Various types of lasers have been hitherto developed, and several inventions on terraced substrate structure type lasers have been also proposed by the inventors which are assigned to the assignee of the present case. Such terraced substrate structure laser intends to provide an active layer which has variation of refractive index in the direction parallel to the junction face of the active layer, thereby to confine its lasing mode in the part of a higher refractive index, and as a result stabilize transverse oscillation mode. FIG. 1 shows one of the representative structure of the terraced substrate structure type transverse mode laser capable of stable oscillation, and comprises the following parts:

| | |
|---|---|
| a substrate 1 terraced shape | of $n^+$-GaAs, |
| a first clad layer 2 having a triangular part 21 | of $n$-Ga$_{1-x}$Al$_x$As, |
| an active layer 3 having an oblique lasing region 31 | of non-doped Ga$_{1-y}$Al$_y$As, |
| a second clad layer 4 | of $p$-Ga$_{1-z}$Al$_z$As, |
| a contacting layer 5 | of $p^+$-GaAs, and |
| an isolation layer 6 having stripe-shaped opening 61 | of Si$_3$N$_4$, |
| a positive side electrode layer 7 | of Ti, Pt, Au layer |
| a negative side electrode layer 8 | of Au—Ge—Ni layer. |

The layers 2, 3, 4, 5 and 6 are formed by sequential epitaxial growths on the substrate 1, which is formed in a terrace shape having a step part. Therein the first clad layer 2 has a triangular part 21 at the step part, and accordingly the active layer 3 is shaped on the triangular part 21, so as to have an oblique lasing region 31 defined between a higher bending portion 32 and a lower bending portion 33. In this structure, the thickness of the first clad layer 2 under the lasing region 31 is thicker than those under other parts of the active layer 4. That is, the triangular part 21 of the first clad layer 2 at the thickest part is about 1 $\mu$m thick, and a lower horizontal part and an upper horizontal part of the first clad layer 2 is only 0.3 $\mu$m thick. The emission in the active layer 3 on the upper or lower horizontal part is absorbed by the substrate 1, while the emission in the lasing region 31 on 1 $\mu$m thick triangular region 21 is not absorbed by the substrate 1 and makes a single spot lasing. Furthermore, by means of the thickness difference between the lasing region 31 and the upper and the lower horizontal part, a folded ridge type or rib type light waveguide is formed, wherein the effective refractive index is higher in the oblique lasing region 31 in comparison with horizontal parts of the active layer 3, resulting in further stability of lasing mode. Accordingly, by designing the distance between the upper bending portion 32 and the lower bending portion, i.e., the width of the oblique lasing region 31, sufficiently small that only the fundamental transverse mode is confined, a light L by a single spot lasing can be obtained.

In such terraced substrate structure laser, the problem is that, due to oblique disposing of the lasing region with respect to the stripe shaped contacting face of the positive side electrode 7, i.e., the current injection face, the injected current is likely to diverge widely to the lower part of the active region far beyond the lower bending portion 33, since the distance from the stripe shaped injection face of the positive side electrode 7 to active layer 3 is larger in the lower part than that in the upper part. Due to such wasteful divergence of the injected current to the lower part of the active layer 3, the injection efficiency of the current to the lasing region 31 is lowered. Furthermore, the second clad layer 4 and the active layer 3 is likely to be gradually thicker as the position becomes apart from the step part, and at the same time, the lower bending portion 33 of the active layer 3 is likely to be dull. These two phenomena are adverse to the injection efficiency and to the formation of a small spot light beam.

SUMMARY OF THE INVENTION

The present invention can provide a terraced substrate structure semiconductor laser capable of more stable performance of fundamental mode lasing and higher injection efficiency by limiting wasteful divergence of injected current to a lower horizontal part of the active layer.

DESCRIPTION OF THE PREFERRED EMBODIMENT

A semiconductor laser in accordance with the present invention comprises:
a terrace-shaped semiconductor substrate having an upper face, a lower face and a step part disposed between said upper face and said lower face,
a clad layer formed on said terrace shaped semiconductor substrate and including at least an upper part formed on said upper face and a step part having a triangular section and formed at a corner defined by said lower face and said step part, said step part being thicker than said upper part, an active layer formed on said first clad layer and including a horizontal upper part formed on said upper part of said first clad layer and an oblique lasing region formed oblique on said step part of said first clad layer, a current injection electrode having a stripe shaped injection face disposed above said lasing region, wherein said active layer is terminated substantially at a lower end of said oblique lasing region.

The active layer formed on the clad layer on the substrate (a first clad layer) may have a short horizontal lower part besides the abovementioned upper part and the oblique lasing part.

The clad layer is thicker at the step part than the neighboring horizontal part(s). And therefore, the light emitted in the horizontal part of the active layer leaks through the thick horizontal part(s) of the clad layer and is absorbed by the underlying substrate, and hence the oscillation(s) in the horizontal part(s) is suppressed, while the light oscillated in the oblique lasing region, which is formed on a thick step part of the first clad layer, is not absorbed by the substrate. Besides, by means of a bending part of the active layer, the light oscillated in the oblique lasing region is further prevented from leaking out of the lasing region into the neighboring horizontal part thereof. Thus, the light oscillated in the oblique lasing region is effectively confined therein with respect to both directions of its thickness and its width. That is, the confinement of the light with respect to the direction of width of the lasing region (i.e., in the direction parallel to the face of the oblique lasing region) is made by the bending(s) of the active region and further, by the termination of the active region at its lower part.

The termination of the active layer substantial at the lower end of the oblique lasing region also attains wasteful flowing of the diverged part of the injected current into a non-oscillating lower horizontal region of the active layer. Therefore, by the termination, the current injection efficiency is improved.

Figure 2:
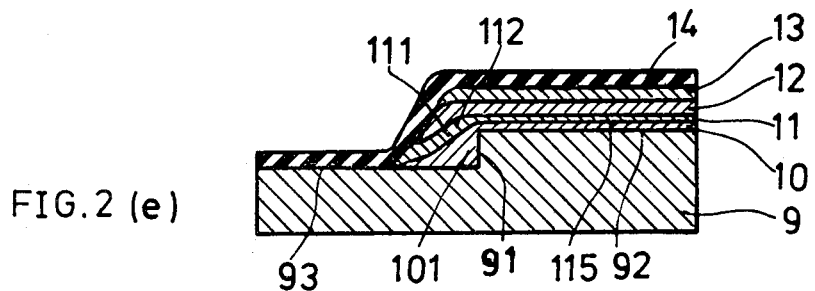
FIG. 2(a), FIG. 2(b), FIG. 2(c), FIG. 2(d), FIG. 2(e) and FIG. 2(f) are sectional elevation views elucidating steps of making a semiconductor laser embodying the present invention.
FIG. 2(g) is a perspective view showing a semiconductor laser manufactured in accordance with the steps of FIG. 2(a) to FIG. 2(f) of the present invention.
Figure 2:
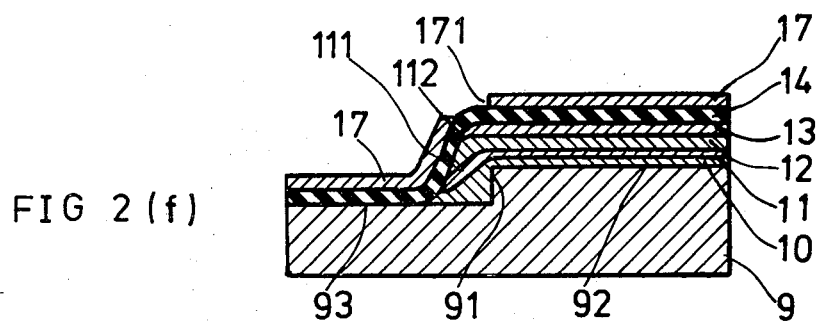
Figure 2:
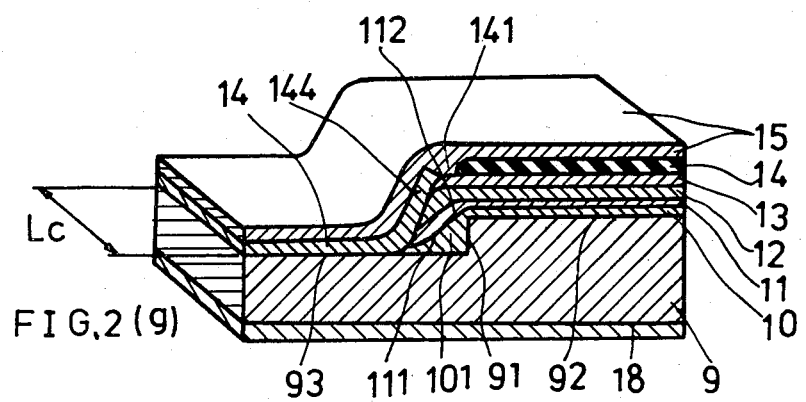

The present invention is elucidated in detail referring to the accompanying drawings FIG. 2(a) and thereafter showing preferred embodiments in accordance with the present invention.

FIG. 2(a), FIG. 2(b), FIG. 2(c), FIG. 2(d), FIG. 2(e), FIG. 2(f) and FIG. 2(g) show steps of manufacturing a first example a semiconductor laser embodying the present invention.

A known photoresist film of a stripe-shape pattern, for example, of 250 μm pitches and 125 μm openings is formed on an n-type single crystalline GaAs substrate in a manner that the stripe pattern is perpendicular to cleaved face (110). Then, a chemical etching is carried out, by utilizing said stripe-shaped photoresist film as a mask by using a known reaction-determining etchant of $H_2SO_4 + H_2O_2 + H_2O$, thereby to etch to the depth of 1.5 μm, thereby to form terrace-shaped substrate 9 as shown by FIG. 2(a).

Then a double heterostructure is formed by liquid phase epitaxial growths on this substrate 9, by using, for example, a known slide boat. The epitaxial growths are made by starting from a growth starting temperature of 845° C. and a cooling rate of 30° C./min, so that the following epitaxial layers are formed as shown in FIG. 2(b):

| on the terrace-shaped substrate 9 | of $n^+$-GaAs: |
|---|---|
| a first clad layer 10 having a triangular part 101 (0.2 μm thick at the horizontal part) | of n-$Ga_{0.65}Al_{0.35}As$ |
| an active layer 11 having an oblique lasing region 31 (0.1 μm thick at the horizontal part) | of non-doped $Ga_{0.95}Al_{0.05}As$ |
| a second clad layer 12 (1.0 μm thick) | of p-$Ga_{0.65}Al_{0.35}As$ |
| a contacting layer 16 (1.0 μm thick) | of $p^+$-GaAs |

In the abovementioned example, the effective thickness of the triangular part 101 of the first clad layer 10 is about 1 μm, and the thickness of the oblique lasing region 111 of the active layer 11 is about 0.12 μm.

A photoresist etching mask 16 is formed on the epitaxial grown substrate in a manner to expose the substrate from the midway part of the oblique lasing region 111 to the lower horizontal part 114 of the active layer 11 as shown in FIG. 2(c). Then, the epitaxially grown layers 10 to 13 at the part exposed from the photoresist film 13 is removed as shown in FIG. 2(d) by a chemical etching using an etchant made by blending:

| $H_2SO_4$ (95% aqueous solution) | 1 volume part, |
|---|---|
| $H_2O_2$ (30% aqueous solution) | 10 volume part and |
| $H_2O$ | 1 volume part. |

Then, after removing the photoresist mask 16, an insulation film 14, for example, $Si_3N_4$ film is formed by a sputtering method on the substrate as shown in FIG. 2(e), and then another etching mask 17 having a stripe shaped opening 171 above the oblique lasing region 111 is formed as shown in FIG. 2(f). Then by etching the insulation mask 14 by using the second photoresist mask 17, a stripe shaped opening 141 is formed on the insulation film 14. Through the opening 141, zinc as an impurity is diffused into the contact layer 13 for ohmic contacting.

Thereafter a p-side electrode 15 is formed by sputtering of Ti followed by sequential sputtering of Pt, and further followed by a vacuum deposition of Au, thereby making a stripe shaped electrode 15 contacting through the stripe shaped opening 141 of the insulation layer 14.

Then an n-side electrode 18 is formed on the bottom face of the substrate 9 by a vacuum deposition of Au-Ge-Ni followed by an alloying treatment.

In the laser shown in FIG. 2(g), which is made by the abovementioned process, the oblique lasing region 111 of the active layer 11 is terminated at the lower end thereof, and an oblique part 144 of the insulation layer 14 forms a border, not only as the border of the laser cavity with a difference of refractive index from that of the lasing region 111 of the active region, but also as the border of path of injected current. By means of the latter current path border, substantially the whole part of the injected current is led into the lasing region, thereby substantially enabling an elimination of the wasteful part of the injected current which does not flow into a lasing region of an active layer.

Figure 1:
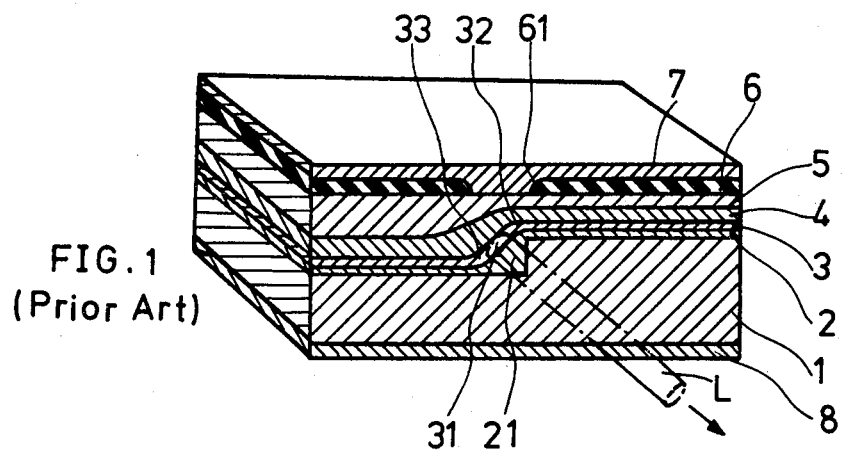
FIG. 1 is a perspective view of a conventional terrace structure semiconductor laser.

The laser of the example of FIG. 2(g) indicates a considerable decrease of threshold current in comparison with a conventional terraced structure laser as shown in FIG. 1, and furthermore an external differential quantum efficiency is improved. Therefore, light output is increased more than twice.

Figure 4:
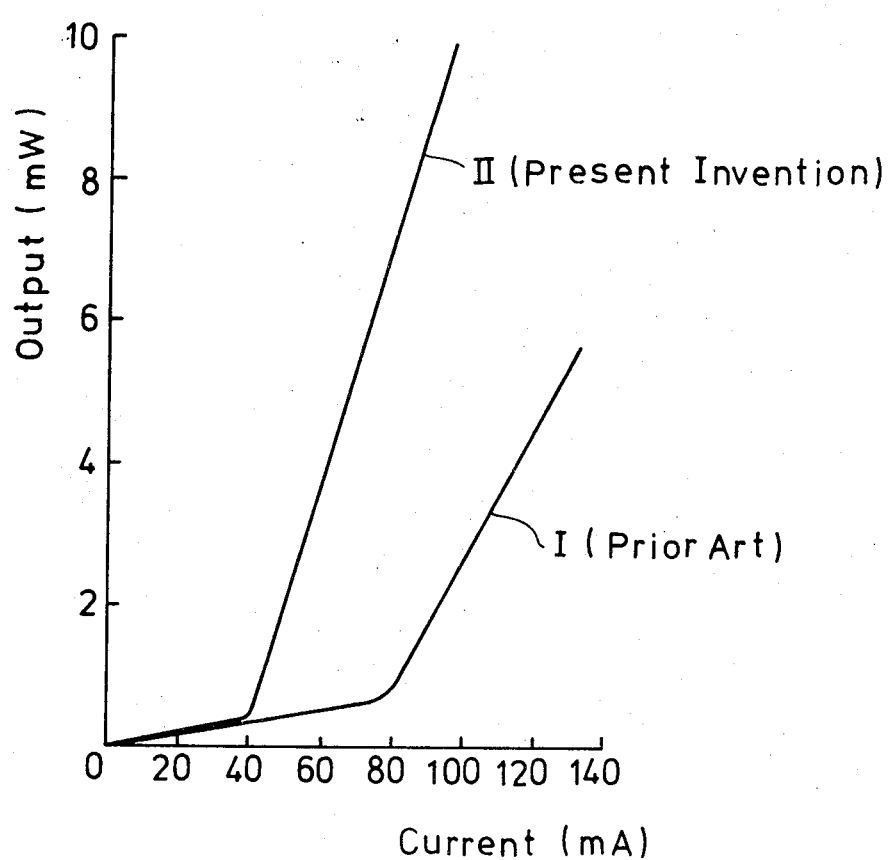
FIG. 4 is a graph showing relation between injection current and laser light output of a laser embodying the present invention.

FIG. 4 is a graph comparatively showing relations between input current and the light output. Curve I shows the characteristic of the terraced structure laser of the prior art of FIG. 1 and curve II shows the characteristic of the example of FIG. 2(g) in accordance with the present invention. The curves are under the operating conditions of at 300° K. (room temperature), in CW (continuous wave) operation and with cavity length Lc of FIG. 2(g) of 250 μm. As shown by the curves, the threshold current of the laser of the present invention is about only half of the conventional laser, and furthermore the slope of curve II is greater than curve I and therefore the external differential quantum efficiency, that is, the lasing efficiency increases and the light output increases.

Figure 3:
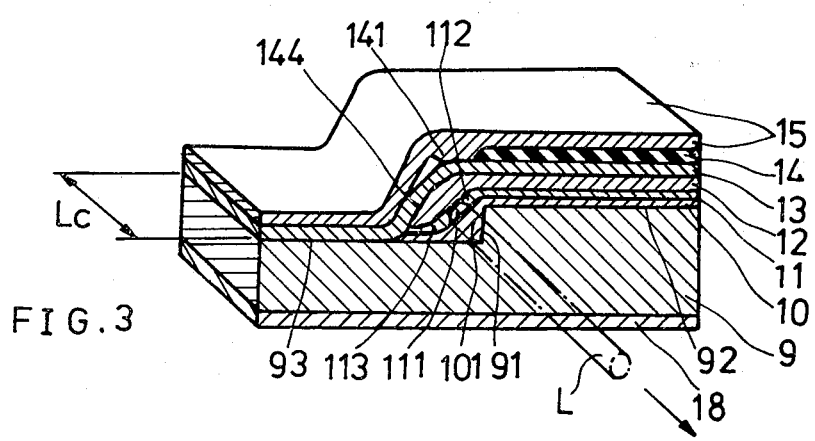
FIG. 3 is a perspective view showing another semiconductor laser embodying the present invention.

FIG. 3 shows another example, wherein the termination of the active layer 11 is made a little leftside of the figure in comparison with that of the example of FIG. 2(g). That is, in this example of FIG. 3, the oblique part 144 of the insulation layer 14 is disposed more leftwards position than that of FIG. 2(g), and therefore the active layer 11 is terminated at a part of the lower horizontal part, that is a little left part of the lower bending part 113. In this FIG. 3 example, the light confinement is attained by means of the difference of effective refractive index due to change of thickness of the active layer 11 at the lower bending part 113, different from the example of FIG. 2(g) where the light confinement is attained by the difference of the effective refractive index at the contact face between the lower part of the lasing region 111 and the insulation layer 144.

In another modified example, the insulation layer 14 can be made of a high resistivity semiconductor layer such as having a sheet resistance of over $10^3 \Omega.cm$ formed by, for example, a vapor deposition and an epitaxial growth.

Figure 5:
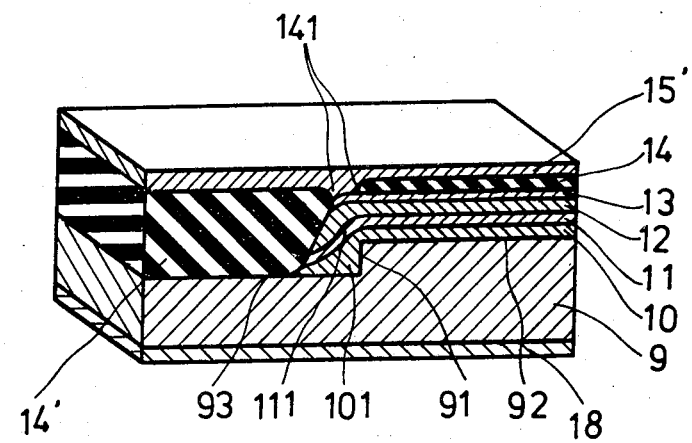
FIG. 5 is a perspective view showing still another semiconductor laser embodying the present invention.

As still another example, as shown in FIG. 5, an insulation film 14' or a high resistivity semiconductor layer as abovementioned formed on the lower part of the terrace-shaped substrate is made very thick as shown in FIG. 5, for example, by a vapor deposition and an epitaxial growth, so that the upper surface of the laser is almost flat and hence mounting thereof to a heat sink becomes easy.

The abovementioned examples are constituted with the substrate of GaAs and active layer of GaAlAs. However, a laser can be similarly constituted with the substrate of InP and the active layer of InGaAsP in the same configurations as the abovementioned examples, and such lasers also perform the similar effect as abovementioned.

What is claimed is:

1. In a semiconductor laser, the improvement comprising:
    a terrace-shaped semiconductor substrate having an upper face, a lower face and a step part disposed between said upper face and said lower face,
    a clad layer formed on said terrace-shaped semiconductor substrate and including at least an upper part formed on said upper face and a corner part having a triangular section and formed at a corner defined by said lower face and said step part, said corner part being thicker than said upper part,
    an active layer formed on said first clad layer and including a horizontal upper part formed on said upper part of said first clad layer and an oblique lasing region formed obliquely on said corner part of said first clad layer,
    a current injection electrode having a stripe shaped injection face disposed above said lasing region,
    wherein said active layer is terminated substantially at a lower end of said oblique lasing region.

2. A structure in accordance with claim 1, which further comprises an insulation layer selected from a group consisting of an insulating compound or a high resistivity semiconductor, said insulation layer being disposed on a part of said lower face of said semiconductor substrate in a manner to terminate therewith said lower end of said oblique lasing region and also define said stripe shaped injection face of said current injection electrode.

3. A structure in accordance with claim 1, wherein said semiconductor substrate is GaAs and said active layer is GaAlAs.

4. A structure in accordance with claim 1, wherein said semiconductor substrate is InP and said active layer is InGaAsP.

5. In a semiconductor laser the improvement comprising:
    a terrace-shaped semiconductor substrate having an upper face, a lower face and a step part disposed between said upper face and said lower face,
    a clad layer formed on said terrace-shaped semiconductor substrate and including at least an upper part formed on said upper face and a corner part having a triangular section and formed at a corner defined by said lower face and said step part, said corner part being thicker than said upper part,
    an active layer formed on said first clad layer and including a horizontal upper part formed on said upper part of said first clad layer and an oblique lasing region formed obliquely on said corner part of said first clad layer,
    a current injection electrode having a stripe shaped injection face disposed above said lasing region,
    wherein said active layer is terminated substantially at a lower end of said oblique lasing region, and epitaxial layers including said active layer are removed at a part on said lower face of said semiconductor substrate.

* * * * *